(12) United States Patent
Sharon et al.

(10) Patent No.: US 11,441,060 B2
(45) Date of Patent: Sep. 13, 2022

(54) PARTICULATES FOR ADDITIVE MANUFACTURING TECHNIQUES

(71) Applicant: Delavan Inc., West Des Moines, IA (US)

(72) Inventors: John A. Sharon, West Hartford, CT (US); Ying She, East Hartford, CT (US); Tahany I. El-Wardany, Vernon, CT (US); Wayde R. Schmidt, Pomfret Center, CT (US)

(73) Assignee: Collins Engine Nozzles, Inc., Des Moines, IA (US)

( * ) Notice: Subject to any disclaimer, the term of this patent is extended or adjusted under 35 U.S.C. 154(b) by 5 days.

(21) Appl. No.: 16/577,562

(22) Filed: Sep. 20, 2019

(65) Prior Publication Data

US 2020/0056082 A1 Feb. 20, 2020

Related U.S. Application Data

(62) Division of application No. 14/822,731, filed on Aug. 10, 2015, now abandoned.

(51) Int. Cl.
| | |
|---|---|
| *C09K 5/14* | (2006.01) |
| *C23C 16/26* | (2006.01) |
| *B23K 26/342* | (2014.01) |
| *B23K 15/00* | (2006.01) |
| *B33Y 70/00* | (2020.01) |
| *B33Y 10/00* | (2015.01) |
| *C23C 16/44* | (2006.01) |
| *C23C 16/442* | (2006.01) |
| *B33Y 80/00* | (2015.01) |
| *B23K 35/00* | (2006.01) |
| *B22F 10/20* | (2021.01) |
| *B22F 1/16* | (2022.01) |

(52) U.S. Cl.
CPC .................. *C09K 5/14* (2013.01); *B22F 1/16* (2022.01); *B22F 10/20* (2021.01); *B23K 15/0086* (2013.01); *B23K 26/342* (2015.10); *B23K 35/00* (2013.01); *B33Y 10/00* (2014.12); *B33Y 70/00* (2014.12); *B33Y 80/00* (2014.12); *C23C 16/26* (2013.01); *C23C 16/442* (2013.01); *C23C 16/4417* (2013.01); *Y02P 10/25* (2015.11)

(58) Field of Classification Search
None
See application file for complete search history.

(56) References Cited

U.S. PATENT DOCUMENTS

| | | | |
|---|---|---|---|
| 4,818,562 A | 4/1989 | Arcella et al. | |
| 5,182,170 A | 1/1993 | Marcus et al. | |
| 5,489,449 A * | 2/1996 | Umeya | B01J 8/42 |
| | | | 427/213 |
| 5,593,740 A | 1/1997 | Strumban et al. | |
| 7,521,017 B2 | 4/2009 | Kunze et al. | |
| 8,102,641 B2 * | 1/2012 | Koga | H01G 4/232 |
| | | | 361/306.3 |
| 2011/0095198 A1* | 4/2011 | Smiljanic | C23C 14/0063 |
| | | | 250/396 R |
| 2011/0123383 A1* | 5/2011 | Fuwa | B33Y 40/00 |
| | | | 419/11 |
| 2011/0135840 A1 | 6/2011 | Doye et al. | |
| 2013/0004892 A1 | 1/2013 | Tombs et al. | |
| 2013/0038980 A1 | 2/2013 | Kim et al. | |
| 2013/0045385 A1* | 2/2013 | Kim | B22F 1/02 |
| | | | 428/403 |

FOREIGN PATENT DOCUMENTS

| | | |
|---|---|---|
| CN | 104668554 A | 6/2015 |
| KR | 20140063982 A | 5/2014 |
| KR | 20140084477 A | 7/2014 |
| WO | 2015023439 A1 | 2/2015 |

OTHER PUBLICATIONS

European Search Report received from Intellectual Property Office (IPO) dated Jan. 27, 2017 for Application No. GB1613662.4.
Office Action from corresponding UK Application No. GB1613662.4 dated May 11, 2018.
Examination Report under Section 18(3), prepared by Examiner, of the UK Intellectual Property Office, dated Jul. 22, 2018, issued in corresponding GB Patent Application No. GB1613662.4.
Examination Report under Section 18(3), prepared by Examiner, of the UK Intellectual Property Office, dated Nov. 20, 2018, issued in corresponding GB Patent Application No. GB1613662.4.

* cited by examiner

*Primary Examiner* — Tabatha L Penny

(74) *Attorney, Agent, or Firm* — Locke Lord LLP; Daniel J. Fiorello; Gabrielle L. Gelozin

(57) ABSTRACT

A method of making a particulate for an additive manufacturing technique includes receiving particulate at a chemical vapor deposition (CVD) reactor, flowing a hydrocarbon gas into the CVD reactor, decomposing the hydrocarbon gas in the CVD reactor, and depositing a carbonaceous coating on the particulate using a product of the decomposed hydrocarbon gas. The coating deposited over the particulate has a reflectivity that is lower than the reflectivity the underlying particulate body to reduce an energy input requirement for purposes of fusing the particulate into a layer of an article using an additive manufacturing technique. In embodiments, the coated particulate can be received at an additive manufacturing apparatus and fused into a layer of an article as a metallic-carbon composite using a high-density energy source.

8 Claims, 4 Drawing Sheets

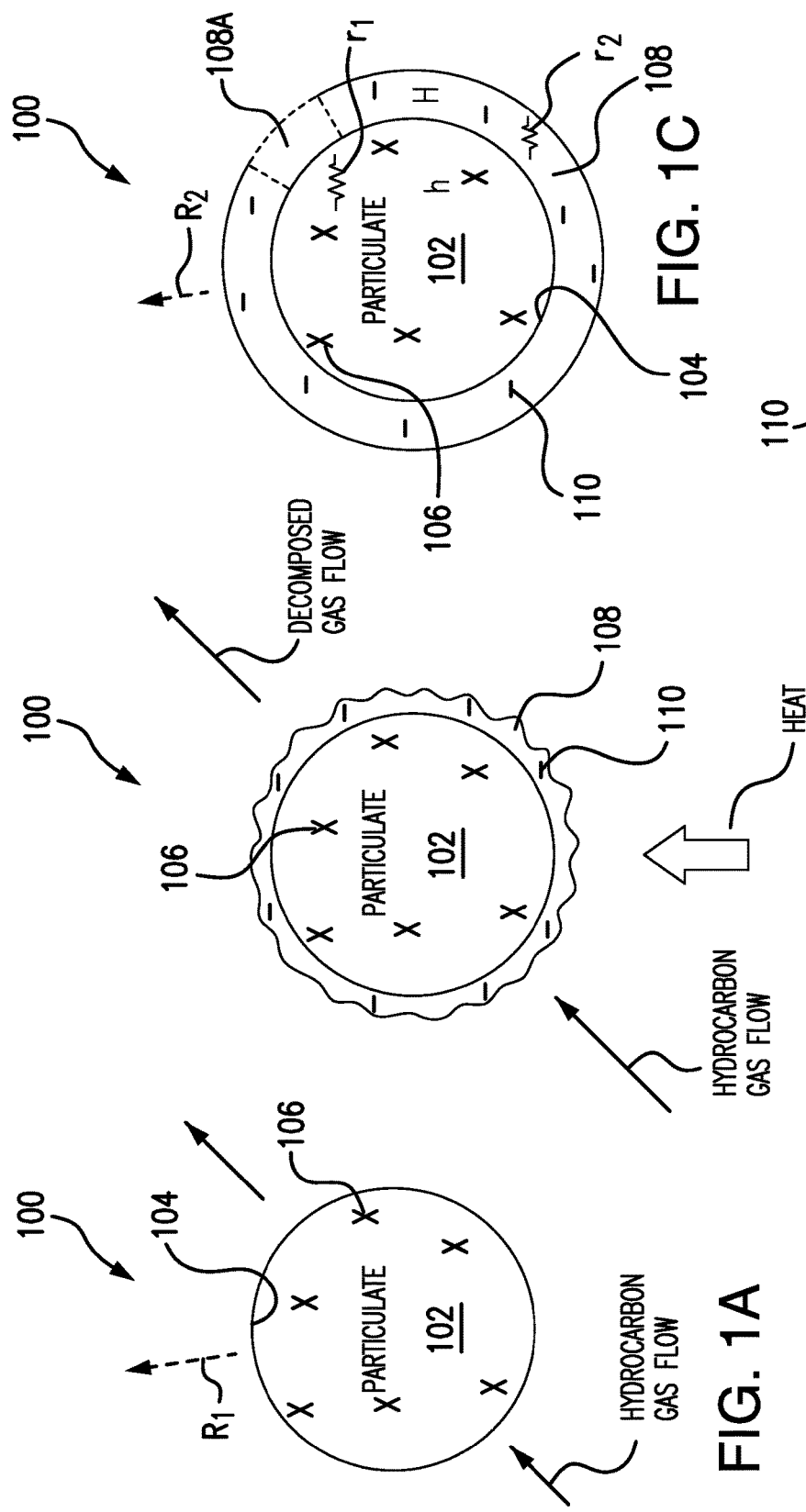
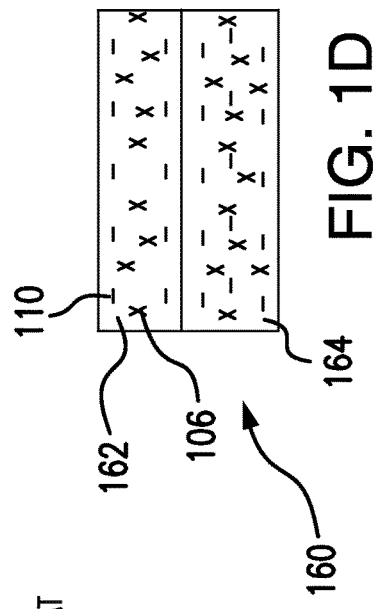

PARTICULATES FOR ADDITIVE MANUFACTURING TECHNIQUES

CROSS-REFERENCE TO RELATED APPLICATION

This application is a Divisional Application of U.S. Patent Application Ser. No. 14/822,731 filed on Aug. 10, 2015, which is incorporated herein by reference in its entirety.

GOVERNMENT LICENSE RIGHTS STATEMENT

This invention was made with government support under Contract No. DE-AR-0000308 awarded by the Department of Energy. The government has certain rights in the invention.

BACKGROUND OF THE INVENTION

1. Field of the Invention

The present disclosure relates to additive manufacturing, and more specifically to particulates and methods of making particulates for additive manufacturing techniques.

2. Description of Related Art

Additive manufacturing techniques are commonly used to fabricate structures by adding successive layers to a substrate. Some additive manufacturing techniques form the layers by fusing particulate to the underlying layer as an integral layer, generally through application of a laser beam or electron beam provided by a high-density energy source. The beam is scanned over the particulate according to the geometry of a two dimensional slice of an article such that a layer of fused particulate forms overlaying the previously formed layer (or substrate). The throughput of such additive manufacturing systems can be influenced by the amount of energy necessary to fuse the particulate into a given layer, particulates requiring smaller input energies enabling greater throughput than particulates requiring greater input energies. The composition of the particulate fused into the layers of the article can influence the mechanical, thermal, and/or electrical properties of the article produced with the additive manufacturing technique.

Such conventional methods and systems have generally been considered satisfactory for their intended purpose. However, there is still a need in the art for improved feedstock with powder particulates and methods of processing such particulates for additive manufacturing techniques. The present disclosure provides a solution for this need.

SUMMARY OF THE INVENTION

A particulate for an additive manufacturing technique includes a particulate body formed from a particulate material and a coating disposed over particulate body. The coating includes a carbonaceous material that has a reflectivity that is lower than a reflectivity of the particulate material to reduce an energy input requirement of the particulate such that less energy is necessary to fuse the particulate into a layer of an article fabricated using the additive manufacturing technique.

In certain embodiments, the particulate material can include one or more of aluminum, copper, nickel, iron, titanium, molybdenum, alloys thereof, ceramic, or any other suitable material. The carbonaceous material can include graphene, carbon nanotubes, or any other suitable carbonaceous material. The carbonaceous material can be disposed over substantially the entire surface of the particles forming the particulate with a lower reflectivity such that more energy incident on the coated particulate is transmitted to the underlying particulate body than were an equivalent amount of energy directly incident upon the surface of the particulate body. It is contemplated that both the particulate material and coating material can be fused together as a metal-carbon composite forming a layer of an article fabricated using an additive manufacturing apparatus.

In accordance with certain embodiments, the material forming the carbonaceous coating can have an electrical resistivity that is lower than the material forming the particulate body. The material forming the carbonaceous coating can have a thermal conductivity that is greater than the thermal conductivity of the material forming the particulate body. It is contemplated that both the particulate body and the carbonaceous coating can be incorporated into an article using an additive manufacturing technique such that the fused material has a lower electrical resistivity and/or a greater thermal conductivity than the material forming the particulate body.

It is also contemplated that, in accordance with certain embodiments, the particulate body can include first and second materials. The first and second materials can include metallic and nonmetallic materials, and in an exemplary embodiment include both copper and phosphorus. For example, in a given batch of copper particulate for an additive manufacturing technique, individual particles can include both copper and phosphorus. The phosphorus may form a relatively small portion of a given particle and can influence the properties of the copper as incorporated into an additively manufactured article.

The first material can have an electrical resistivity that is lower than the electrical resistivity of the second material. The particulate first material can have a thermal conductivity that is greater than the thermal conductivity of the particulate second material. The coating material can have an electrical resistivity that is lower than the electrical resistivity of the particulate second material. The coating material can have an electrical resistivity that is lower than both the first and particulate second materials. The coating material can have a thermal conductivity that is greater than the thermal conductivity of the particulate second material. The coating material can have a thermal conductivity that is greater than both the first and particulate second materials. It is further contemplated that, when fused together using the additive manufacturing technique, an article including the particulate can have mechanical strength that is superior to that of articles formed without a carbonaceous coating.

A method of making a particulate for an additive manufacturing technique includes receiving particulate at a chemical vapor deposition (CVD) reactor, flowing a hydrocarbon gas into the CVD reactor, decomposing the hydrocarbon gas in the CVD reactor, and depositing a carbonaceous coating on the particulate using a product of the decomposed hydrocarbon gas. The coating deposited over the particulate has a reflectivity that is lower than the reflectivity the underlying particulate body to reduce an energy input requirement for purposes of fusing the particulate into a layer of an article using an additive manufacturing technique. In embodiments, the coated particulate can be received at an additive manufacturing apparatus and fused into a layer of an article as a metallic-carbon composite using a high-density energy source.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIGS. 1A-1D are a schematic side cross-sectional views of a feedstock particulate for an additive manufacturing technique, showing a carbonaceous coating being applied over an exterior surface of a particulate body;

DETAILED DESCRIPTION OF THE PREFERRED EMBODIMENTS

Figure 2:
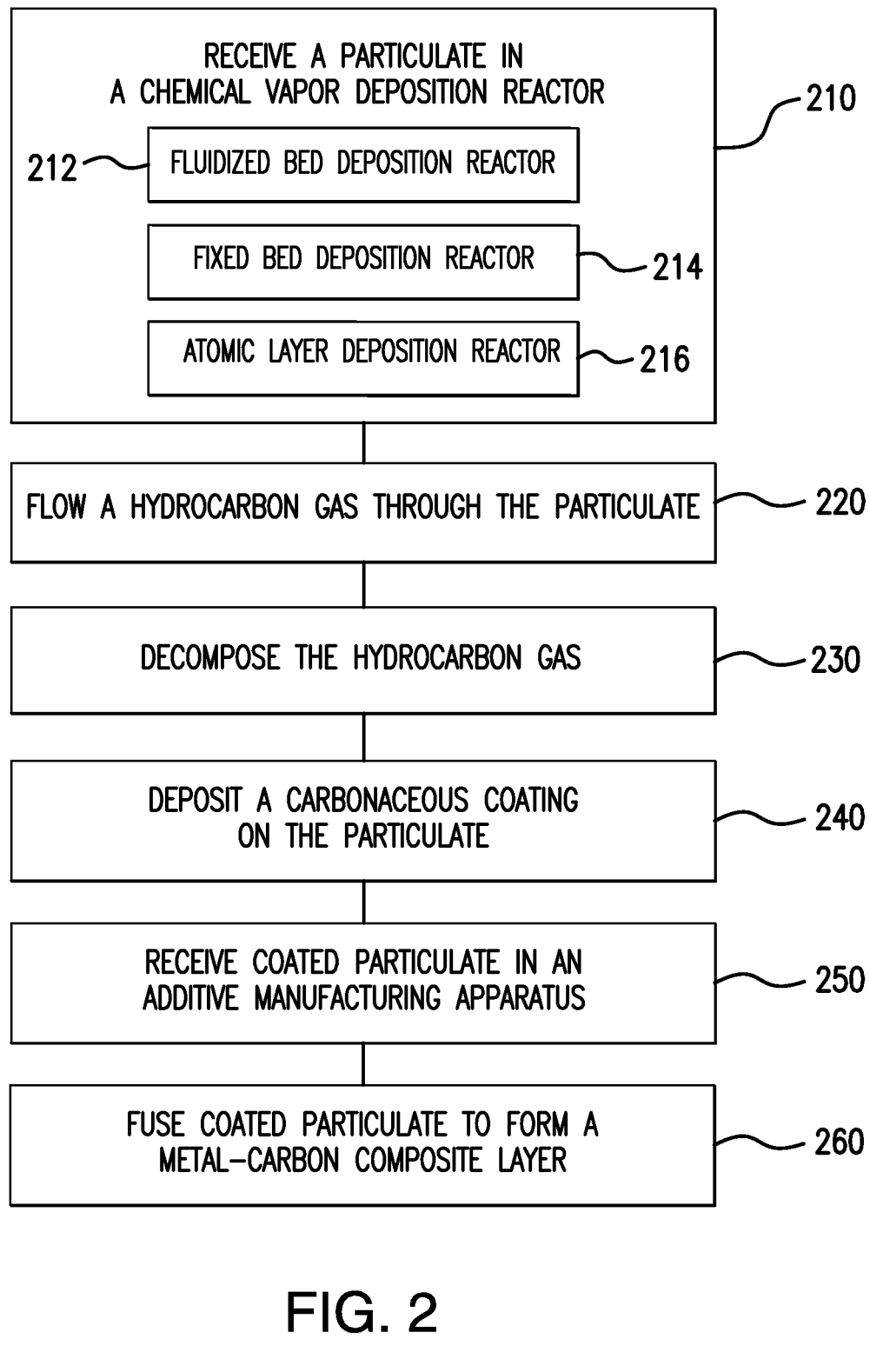
FIG. 2 is a schematic view of a method for making particulate and feedstock for an additive manufacturing technique.

Reference will now be made to the drawings wherein like reference numerals identify similar structural features or aspects of the subject disclosure. For purposes of explanation and illustration, and not limitation, a partial view of an exemplary embodiment of a particulate in accordance with the disclosure is shown in FIGS. 1A-1D and is designated generally by reference character 100. Other embodiments of particulate, feedstock, apparatus for making particulate and feedstock, and methods of making particulate and feedstock in accordance with the disclosure, or aspects thereof, are provided in FIGS. 2-5, as will be described. The systems and methods described herein can be used for making particulate and particulate feedstock for additive manufacturing techniques.

Referring to FIGS. 1A-1C, particulate 100 is shown. With reference to FIG. 1A, particulate 100 includes a particulate body 102 with a surface 104. Particulate body 102 is formed from a particulate material 106 with an electrical resistivity $r_1$ (shown in FIG. 1C), a thermal conductivity h (shown in FIG. 1C), and a reflectivity $R_1$. Particulate material 106 may be a metallic material and can include one or more of aluminum, copper, nickel, iron, titanium, molybdenum, alloys thereof, and ceramic. In an exemplary embodiment particulate material 106 includes copper suitable for use in an additive manufacturing technique for purposes of forming an electrical conductor.

Figure 3:
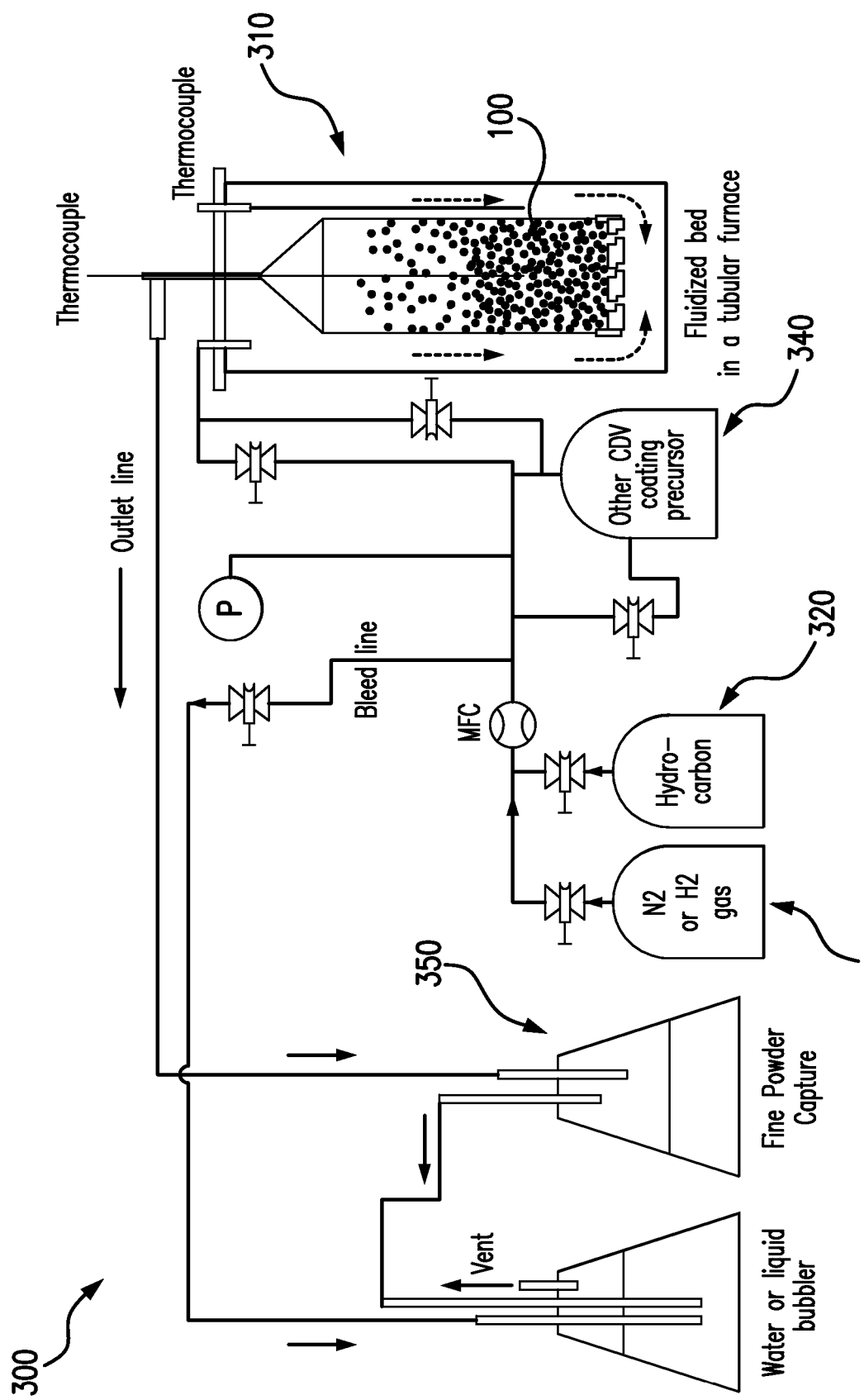
FIG. 3 is a schematic view of a fluidized bed apparatus for making the particulate of FIG. 1, showing a carbonaceous gas source coupled to a fluidized bed.

As indicated with the flow arrows oriented toward particulate 100 in FIG. 1A, particulate 100 is received within a chemical vapor deposition reactor 310 (shown in FIG. 3). A hydrocarbon gas is flowed across particulate 100 and decomposed into decomposition products, one or more of which is used for coating particulate 100.

With reference to FIG. 1B, as the hydrocarbon gas flows over particulate 100 and decomposes, a carbonaceous coating 108 deposits over surface 104 of particulate 100. Carbonaceous coating 108 includes coating material 110. In embodiments, coating material 110 can include at least one of graphene, carbon nanotubes, and/or other carbonaceous forms.

With reference to FIG. 1C, coating material 110 develops as a relatively thin layer over substantially the entire surface 104 of particulate body 102. Coating material 110 has a reflectivity R2. As indicated by the length of reflectivity arrow $R_2$ relative to the reflectivity arrow $R_1$ (shown in FIG. 1A) associated with particulate body 102, reflectivity R2 is lower than reflectivity $R_1$. Depositing carbonaceous coating 108 over surface 104 of particulate body 102 reduces the energy necessary to apply to particulate 100 to fuse particulate 100 into a layer of an article formed using an additive manufacturing technique.

Carbonaceous coating 108 (and coating material 110) also has an electrical resistivity $r_2$ and a thermal conductivity H. In embodiments, electrical resistivity $r_2$ of coating material 110 is lower than electrical resistivity $r_1$ of particulate material 106. In embodiments, thermal conductivity H of coating material 110 is greater thermal conductivity h of particulate material 106. In certain embodiments, electrical resistivity $r_2$ of coating material 110 is lower than electrical resistivity $r_1$ of particulate material 106 and thermal conductivity H of coating material 110 is greater thermal conductivity h of particulate material 106.

With reference to FIG. 1D, a metal-carbon composite article 160 fabricated using an additive manufacturing technique is shown. Metal-carbon composite article 160 includes a first layer 162 overlaying a second layer 164. At least one of the layers is formed by applying a beam from a high-density energy source (not shown for purposes of clarity) to particulate 100 (shown in FIG. 1C) to form metal-carbon composite article 160. Metal-carbon composite article 160 includes both particulate material 106 and coating material 110. Since carbonaceous coating 108 is integrated into metal-carbon composite article 160, metal-carbon composite article 160 has properties influenced by properties of both carbonaceous coating 108 and particulate material 106. It is contemplated that mechanical strength of metal-carbon composite article 160 is greater than that of particulate material 106.

In certain embodiments, electrical resistivity of metal-carbon composite article 160 is lower than electrical resistivity $R_1$ of particulate material 106. In accordance with certain embodiments, thermal conductivity of metal-carbon composite article 160 is greater than that of particulate material 106. In certain embodiments, both electrical resistivity of metal-carbon composite article 160 is lower than electrical resistivity $R_1$ of particulate material 106 and thermal conductivity of metal-carbon composite article 160 is greater than that of particulate material 106. As will be appreciated by those of skill in the art in view of the present disclosure, by applying a predetermined amount of coating material 110 to particulate bodies 102, the electrical, thermal, and/or mechanical properties of metal-carbon composite article 160 can be adjusted as suitable for an intended application. For example, a ratio of particulate material 106 to coating material 110 can be selected such that the resulting resistance of a conductor is relatively small, thereby, thereby enabling fabrication of devices with conductors having smaller gauge than the current rating of the device otherwise requires.

With reference to FIG. 2, a method of making particulate, e.g. particulate 100 (shown in FIG. 1C), is generally indicated with reference numeral 200. As shown with box 210, particulate including particulate bodies, e.g. particulate body 102 (shown in FIG. 1A) is received at a chemical vapor deposition (CVD) reactor. Hydrocarbon gas is then provided to the CVD reactor and is decomposed into hydrocarbon gas decomposition products, as shown with box 230. Decomposition may be through application a predetermined amount of heat and/or pressure, or through any other suitable decomposition process. At least one of the decomposition products deposits over surfaces of the particulate to form a carbonaceous coating, e.g. carbonaceous coating 108 (shown in FIG. 1C), as shown with box 240. The coating deposited over the particulate has a reflectivity that is lower than a reflectivity of underlying particle body to reduce the energy input requirement to fuse the particulate into a layer of an article using an additive manufacturing technique. The coating can also have an electrical resistivity that is lower than the electrical resistivity of the material forming the underlying particulate body. Alternatively or additionally, the coating can have a thermal conductivity that is greater than the thermal conductivity of the underlying particulate body.

The CVD reactor can include fluidized bed deposition reactor 212, a fixed bed reactor deposition 214, an atomic layer deposition reactor 216, or any other suitable deposition apparatus. Fluidized bed deposition reactor 212 allow for conformally depositing carbonaceous coating over substantially the entire surface of the particulate bodies forming the particulate. Fixed bed deposition reactor 214 allows for depositing carbonaceous coatings on only exposed portions of the particulate bodies. For example, as indicated in FIG. 1C in dashed outline, a portion 108A of carbonaceous coating 108 may be omitted, leaving a portion of surface 104 exposed and reducing the amount of carbonaceous material applied to the surface of particulate 106. Atomic layer deposition reactor 216 allows for deposition of extremely thin, e.g. atom(s) thick, carbonaceous coatings over the particulate material. This enables control over relatively small amounts of carbonaceous material deposited on the particulate bodies.

Once coated, the particulate can be received at an additive manufacturing apparatus, as shown with box 250. The particulate can thereafter be fused using a beam from a high-density energy source of the additive manufacturing apparatus to form a layer of an article, e.g. metal-carbon composite article 160 (shown in FIG. 1D), the layer including a metal-carbon composite material, e.g. metal-carbon composite article 160 (shown in FIG. 1D), as shown with box 260. The metal-carbon composite can have an electrical resistivity that is less than the material forming the particulate body and/or can have a thermal conductivity that is greater than the thermal conductivity of the particulate body.

As shown with box 210, method 200 can also include receiving particulate, e.g. particulate 100 (shown in FIG. 1) in a coating deposition apparatus. With reference to FIG. 3, a coating apparatus 300 is shown. Aspects of fluidized bed apparatus 300 are described in U.S. Patent Application No. 61/815,359, U.S. Patent Application No. 61/931,295, and U.S. Patent Application No. 61/980,681, each of which is incorporated herein by reference in their entirety, and which is assigned to the Applicant of the instant application. Particulate 100, e.g. uncoated particulate bodies 102 (shown in FIG. 1A), is loaded in CVD reactor 310. A hydrocarbon gas such as methane or any other suitable hydrocarbon gas is provided to CVD reactor 310 from a hydrocarbon gas source 320. The hydrocarbon gas is decomposed within CVD reactor 310 such that a carbonaceous coating as described above deposits over surfaces of the particulate bodies residing within CVD reactor 310.

Depositing the carbonaceous layer on the particulate material reduces the reflectivity of the particulate, reducing the input energy necessary to fuse the particulate into a layer and on to an underlying substrate. Depositing the carbonaceous layer on the particulate allows for developing layers that are a composite of a particulate material and carbon, potentially improving the mechanical, electrical, and/or thermal properties of articles produced from the coated particulate as well as offsetting degradation from impurities in the particulate.

Figure 4:
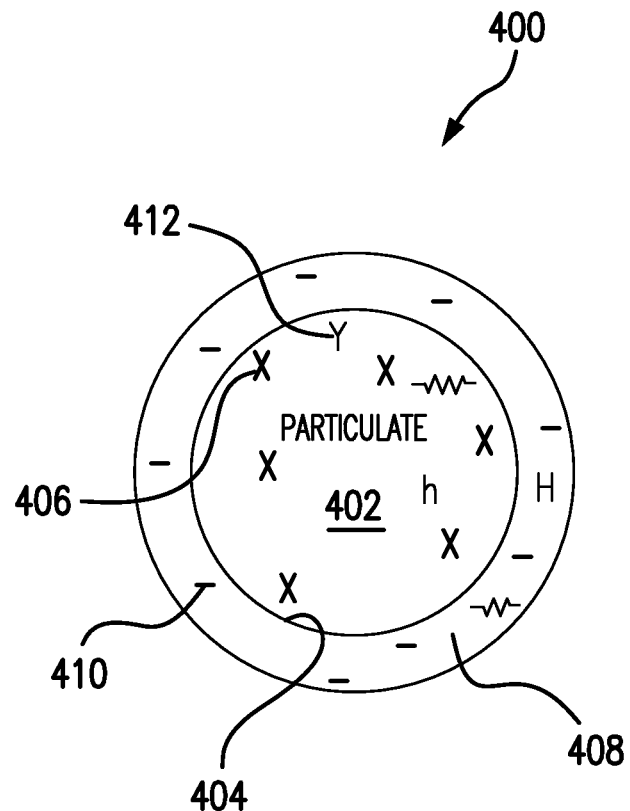
FIG. 4 is a schematic side elevation view of another embodiment of a particulate for an additive manufacturing technique, showing a particulate having a carbonaceous coating disposed on only a portion of the particulate body.
Figure 5:
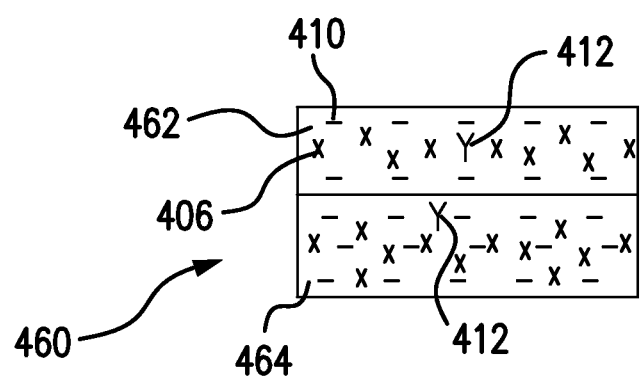
FIG. 5 is a schematic side elevation view of yet another embodiment of a particulate for an additive manufacturing technique, showing a particulate body having a plurality of constituents.

Referring now to FIG. 4 and FIG. 5, a particulate 400 is shown and an article 460 formed by fusing particulate 400 are shown. With reference to FIG. 4, particulate 400 is shown. Particulate 400 is similar to particulate 100 (shown in FIG. 1C), and additionally includes a particulate first material 406 and a particulate second material 412. Particulate second material 412 has at least one property that is different from a corresponding property of particulate first material 406. For example, particulate second material 412 may have an electrical resistivity that is greater than that of particulate first material 406. Particulate second material 412 may have a thermal conductivity that is lower than a thermal conductivity of particulate first material 406. In an illustrative exemplary embodiment, particulate first material 406 includes copper and particulate second material includes phosphorous in a relatively small amount, such as a trace amount of alloyed contaminate.

In embodiments, coating material 410 has an electrical resistivity that is lower than the electrical resistivity of particulate second material 412. In certain embodiments, coating material has an electrical resistivity that is lower than electrical resistivity of both particulate first material 406 and particulate second material 412. As will be appreciated, coating particulate body 402 with a predetermined amount of coating material 410 enables offsetting the effect of one or more trace materials, e.g. particulate second material 412, that may be included in particulate body 402. In this respect carbonaceous coating 408 can reduce the effect that particulate second material 412 may have on the electrical and/or physical properties of particulate 400 when fused into an article 460 (shown in FIG. 5) having one or more layers formed of a metal-carbon composite 462 (also shown in FIG. 5). For example, conductors (e.g. article 460) formed using additive manufacturing techniques may be matched in terms of electrical, thermal, and/or mechanical properties by modulating the amount of carbonaceous material included in the particulate used to form the conductor. Metal-carbon composite 462 may also have mechanical strength greater than the material forming particulate body 102 (shown in FIG. 1A) and particulate body 402 (shown in FIG. 4).

Particulates with high reflectivity typically do not absorb a significant fraction of the input energy received from energy sources employed in some additive manufacturing techniques. Higher power can therefore be required for certain particulate melting, fusion, and/or sintering processes. Feedstock for additive manufacturing techniques can also contain unintended constituent materials that may alter the desired mechanical, thermal and/or electrical properties of structures developed using the feedstock. In embodiments described herein, a relatively thin coating (atoms thick in certain embodiments) of a carbonaceous material is applied to the surface particulate bodies forming a particulate feedstock for an additive manufacturing technique. The coating is applied to the particulate and reduces reflection of energy incident upon the coated of the particulate. In certain embodiments, the coating becomes part of the structure formed by the fused particulate, offsetting degradation in mechanical, thermal and/or electrical properties that otherwise would be associated with contaminate included in the particulate when fused to form the structure.

The methods and systems of the present disclosure, as described above and shown in the drawings, provide for particulate materials with superior properties including the ability to formed metal-carbon composites with improved electrical, thermal, and/or mechanical properties. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of making a coated particulate for an additive manufacturing technique, the method comprising:
   receiving particulate at a chemical vapor deposition (CVD) reactor;
   flowing a hydrocarbon gas into the CVD reactor;
   decomposing the hydrocarbon gas in the CVD reactor; and
   depositing a carbonaceous coating on a body of the particulate using a product of the decomposed hydrocarbon gas, wherein the carbonaceous coating has a reflectivity that is lower than a reflectivity of the particulate body to reduce an energy input requirement of the coated particulate to fuse the coated particulate into a layer of an article using an additive manufacturing technique, wherein the particulate body includes a first material and a second material separate from the first material, the first material having an electrical resistivity that is lower that an electrical resistivity of the second material, wherein the carbonaceous coating has an electrical resistivity that is lower than the electrical resistivity of the second material, wherein depositing the carbonaceous coating on the particulate includes depositing a carbonaceous layer including graphene on a surface of the particulate in the CVD reactor, and further including receiving coated particulate at an additive manufacturing apparatus, and fusing the coated particulate into a layer of an article using an external energy source.

2. The method as recited in claim 1, wherein the particulate body includes a metallic material.

3. The method as recited in claim 1, wherein the particulate body includes at least one of aluminum, copper, nickel, iron, titanium, molybdenum, alloys thereof, and ceramic.

4. The method as recited in claim 1, wherein the carbonaceous coating has an electrical resistivity that is lower than an electrical resistivity of the particulate body.

5. The method as recited in claim 1, wherein the carbonaceous coating has a thermal conductivity that is greater than a thermal conductivity of the particulate body.

6. The method as recited in claim 1, wherein the particulate body includes copper and phosphorus.

7. A method of making a coated particulate for an additive manufacturing technique, the method comprising:
   receiving particulate at a chemical vapor deposition (CVD) reactor;
   flowing a hydrocarbon gas into the CVD reactor;
   decomposing the hydrocarbon gas in the CVD reactor; and
   depositing a carbonaceous coating on a body of the particulate using a product of the decomposed hydrocarbon gas, wherein the carbonaceous coating has a reflectivity that is lower than a reflectivity of the particulate body to reduce an energy input requirement of the coated particulate to fuse the coated particulate into a layer of an article using an additive manufacturing technique, wherein the particulate body includes a first material and a second material separate from the first material, the first material having an electrical resistivity that is lower that an electrical resistivity of the second material, wherein the carbonaceous coating has an electrical resistivity that is lower than the electrical resistivity of the second material, wherein depositing the carbonaceous coating on the particulate includes depositing a carbonaceous layer including graphene on a surface of the particulate in the CVD reactor, further comprising using the coated particulate in an additive manufacturing procedure.

8. The method as recited in claim 1, wherein an electrical resistivity of the carbonaceous coating is lower than an electrical resistivity of both the first and second materials of the particulate body.

* * * * *